(12) United States Patent
Lin et al.

(10) Patent No.: US 10,770,328 B2
(45) Date of Patent: *Sep. 8, 2020

(54) SUBSTRATE SUPPORT WITH SYMMETRICAL FEED STRUCTURE

(71) Applicant: APPLIED MATERIALS, INC., Santa Clara, CA (US)

(72) Inventors: Xing Lin, San Jose, CA (US); Douglas A. Buchberger, Jr., Livermore, CA (US); Xiaoping Zhou, San Jose, CA (US); Andrew Nguyen, San Jose, CA (US); Anchel Sheyner, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/121,844

(22) Filed: Sep. 5, 2018

(65) Prior Publication Data

US 2019/0051551 A1 Feb. 14, 2019

Related U.S. Application Data

(63) Continuation of application No. 14/840,204, filed on Aug. 31, 2015, now Pat. No. 10,096,494, which is a (Continued)

(51) Int. Cl.
*H01L 21/683* (2006.01)
*H01J 37/32* (2006.01)
*H01L 21/67* (2006.01)

(52) U.S. Cl.
CPC .... *H01L 21/6831* (2013.01); *H01J 37/32532* (2013.01); *H01J 37/32577* (2013.01);
(Continued)

(58) Field of Classification Search
USPC .................................................. 118/715–733
See application file for complete search history.

(56) References Cited

U.S. PATENT DOCUMENTS

| 5,250,137 A | 10/1993 | Arami et al. |
| 5,478,429 A * | 12/1995 | Komino ............ H01J 37/32045 |
| | | 118/723 E |

(Continued)

FOREIGN PATENT DOCUMENTS

| JP | H04-078133 A | 3/1992 |
| JP | 2002-197927 A | 12/2002 |

(Continued)

OTHER PUBLICATIONS

International Search Report and Written Opinion dated May 7, 2012 for PCT Application No. PCT/US2011/057024.

(Continued)

*Primary Examiner* — Rakesh K Dhingra
(74) *Attorney, Agent, or Firm* — Moser Taboada Alan Taboada

(57) ABSTRACT

Apparatus for processing a substrate is disclosed herein. In some embodiments, a substrate support may include a substrate support having a support surface for supporting a substrate the substrate support having a central axis; a first electrode disposed within the substrate support to provide RF power to a substrate when disposed on the support surface; an inner conductor coupled to the first electrode about a center of a surface of the first electrode opposing the support surface, wherein the inner conductor is tubular and extends from the first electrode parallel to and about the central axis in a direction away from the support surface of the substrate support; an outer conductor disposed about the inner conductor; and an outer dielectric layer disposed between the inner and outer conductors, the outer dielectric (Continued)

layer electrically isolating the outer conductor from the inner conductor. The outer conductor may be coupled to electrical ground.

20 Claims, 4 Drawing Sheets

Related U.S. Application Data continuation of application No. 12/910,547, filed on Oct. 22, 2010, now Pat. No. 9,123,762.

(52) U.S. Cl.
CPC .. *H01J 37/32715* (2013.01); *H01J 37/32724* (2013.01); *H01L 21/67069* (2013.01)

(56) References Cited

U.S. PATENT DOCUMENTS

| | | |
|---|---|---|
| 5,671,116 A | 9/1997 | Husain |
| 5,968,379 A | 10/1999 | Zhao et al. |
| 6,081,414 A | 6/2000 | Flanigan et al. |
| 6,217,705 B1 | 4/2001 | Tamura et al. |
| 6,462,928 B1 | 10/2002 | Shamouilian et al. |
| 6,534,751 B2 | 3/2003 | Uchiyama et al. |
| 7,045,014 B2 | 5/2006 | Mahon et al. |
| 7,354,288 B2 | 4/2008 | Maehara et al. |
| 7,973,266 B2 | 7/2011 | Nakajima et al. |
| 2004/0226514 A1 | 11/2004 | Mahon et al. |
| 2005/0194374 A1 | 9/2005 | Gelatos et al. |
| 2005/0274324 A1 | 12/2005 | Takahashi et al. |
| 2006/0005930 A1 | 1/2006 | Ikeda et al. |
| 2006/0272774 A1 | 12/2006 | Maehara et al. |
| 2008/0116196 A1 | 5/2008 | Nakajima et al. |
| 2009/0236214 A1 | 9/2009 | Janakiraman et al. |
| 2009/0274590 A1 | 11/2009 | Willwerth et al. |
| 2010/0018648 A1 | 1/2010 | Collins et al. |

FOREIGN PATENT DOCUMENTS

| | | |
|---|---|---|
| JP | 2004-342984 A | 12/2004 |
| JP | 2005-166354 | 6/2005 |
| JP | 2005-5347620 A | 12/2005 |
| JP | 2007-088484 | 4/2007 |
| JP | 2008-085329 | 4/2008 |
| JP | 2009-076598 | 4/2009 |
| JP | 2008-166509 | 7/2009 |
| JP | 2009-182139 | 8/2009 |
| JP | 2010-109316 | 5/2010 |
| JP | 2010-177595 | 8/2010 |
| KR | 2004-0031691 | 4/2004 |
| KR | 2009-0078514 | 7/2009 |
| TW | 200809999 A | 2/2008 |

OTHER PUBLICATIONS

Search Report for Taiwan Invention Patent Application No. 100137965 dated Oct. 7, 2015.
Search Report for Taiwan Invention Patent Application No. 105106143 dated Oct. 3, 2016.

* cited by examiner

US 10,770,328 B2

SUBSTRATE SUPPORT WITH SYMMETRICAL FEED STRUCTURE

CROSS-REFERENCE TO RELATED APPLICATIONS

This application is a continuation of co-pending U.S. patent application Ser. No. 14/840,204, filed Aug. 31, 2015 which is also a continuation of co-pending U.S. patent application Ser. No. 12/910,547, filed Oct. 22, 2010, which is herein incorporated by reference.

FIELD

Embodiments of the present invention generally relate to substrate processing equipment.

BACKGROUND

As the critical dimensions of devices continue to shrink, factors that may have been irrelevant or of lesser import at large dimensions can become critical at smaller dimensions.

The inventors have provided an improved apparatus that may facilitate improved processing results when processing substrates.

SUMMARY

Apparatus for processing a substrate is disclosed herein. In some embodiments, a substrate support may include a substrate support having a support surface for supporting a substrate the substrate support having a central axis; a first electrode disposed within the substrate support to provide RF power to a substrate when disposed on the support surface; an inner conductor coupled to the first electrode about a center of a surface of the first electrode opposing the support surface, wherein the inner conductor is tubular and extends from the first electrode parallel to and about the central axis in a direction away from the support surface of the substrate support; an outer conductor disposed about the inner conductor; and an outer dielectric layer disposed between the inner and outer conductors, the outer dielectric layer electrically isolating the outer conductor from the inner conductor. In some embodiments, the outer conductor may be coupled to an electrical ground. In some embodiments DC energy may be provided to a second electrode via a second conductor extending along the central axis. In some embodiments, AC energy may be provided to one or more heater electrodes via a plurality of third conductors disposed symmetrically about the central axis. In some embodiments, the second and third conductors may be disposed within an axial opening of the inner conductor.

In some embodiments, a plasma processing apparatus may include a process chamber having an inner volume with a substrate support disposed in the inner volume, the substrate support having a support surface and a central axis; a first electrode disposed in the substrate support to provide RF power to a substrate when present on the substrate support; an inner conductor having a first end coupled to the first electrode about a center of a surface of the first electrode facing away from the support surface, wherein the inner conductor is tubular and extends away from the first electrode parallel to and about the central axis; a first conductor coupled to the inner conductor proximate a second end of the inner conductor, opposite the first end, the first conductor extending laterally from the central axis toward an RF power source disposed off-axis from the central axis, the RF power source to provide RF power to the first electrode; an outer conductor disposed about the inner conductor; and an outer dielectric layer disposed between the inner and outer conductors, the outer dielectric layer electrically isolating the outer conductor from the inner conductor.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
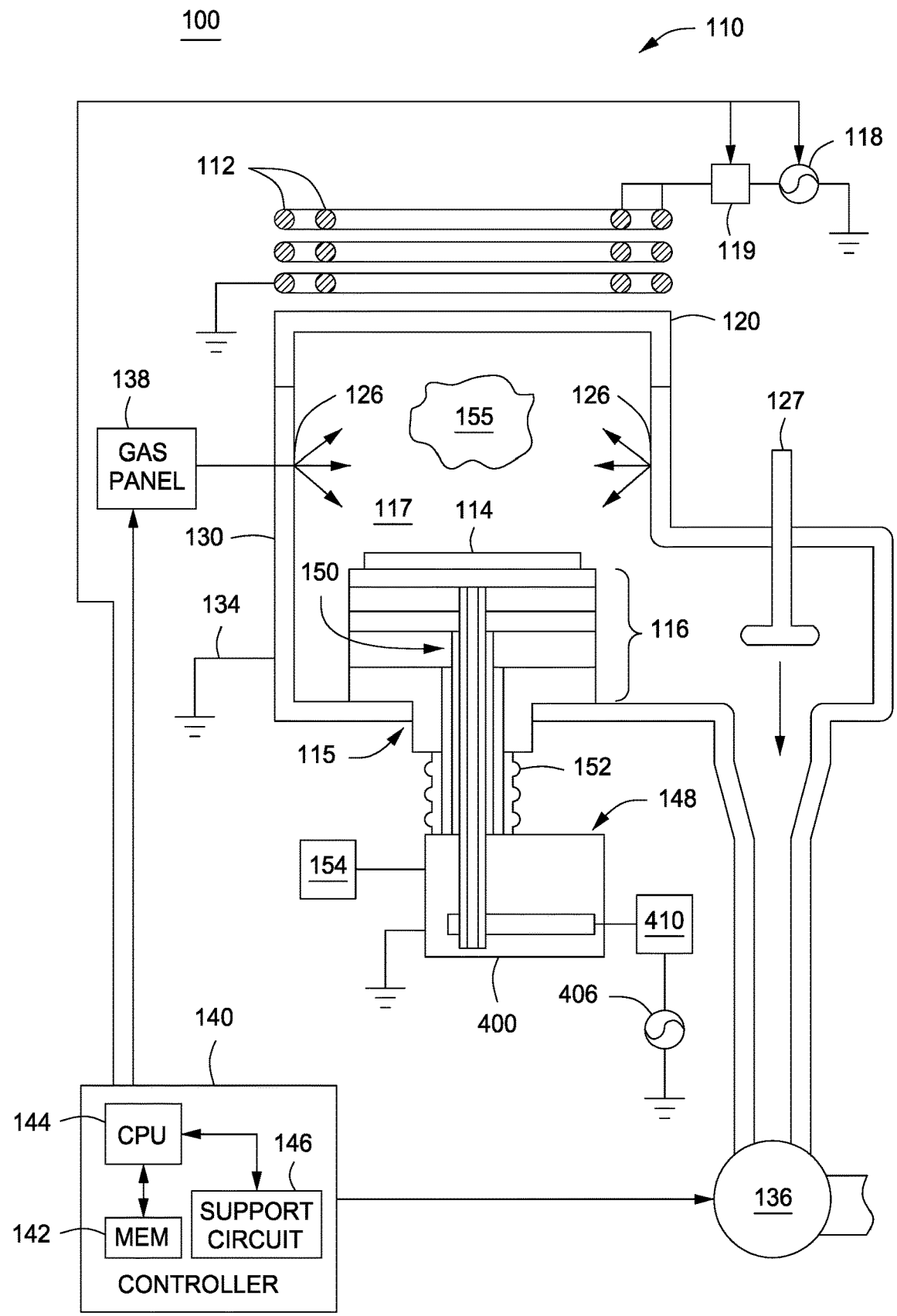
FIG. 1 depicts schematic side view of a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Apparatus for processing a substrate is disclosed herein. The inventors have discovered that a substrate support having an asymmetric electrical feed structure to provide electrical power to an electrode disposed in the substrate support can cause process non-uniformities, for example, such as etch rate and etch dimension non-uniformities on a substrate disposed atop the substrate support. Thus, the inventors have provided a symmetrical electrical feed structure that may be incorporated within a substrate support to advantageously improve etch rate and/or etch dimension uniformities. In some embodiments, the inventive apparatus may advantageously reduce electromagnetic skew along the surface of a substrate by conducting electrical power to the various components of the substrate support via one or more conductors that are symmetrically arranged with respect to a central axis of the substrate support and/or by providing one or more elements for confining or uniformly distributing an electric and/or magnetic field.

FIG. 1 depicts a schematic diagram of an illustrative etch reactor 100 of the kind that may be used to practice embodiments of the invention as discussed herein. The reactor 100 may be utilized alone or, more typically, as a processing module of an integrated semiconductor substrate processing system, or cluster tool, such as a CENTURA® integrated semiconductor substrate processing system, available from Applied Materials, Inc. of Santa Clara, Calif. Examples of suitable etch reactors 100 include the ADVANTEDGE™ line of etch reactors (such as the AdvantEdge S or the AdvantEdge HT), the DPS® line of etch reactors (such as the DPS®, DPS® II, DPS® AE, DPS® HT, DPS® G3 poly etcher), or other etch reactors, available from Applied Materials, Inc. Other etch reactors and/or cluster tools, including those of other manufacturers may be used as well.

The reactor 100 comprises a process chamber 110 having a substrate support 116 disposed within a processing volume 117 formed within a conductive body (wall) 130, and a controller 140. A symmetric electrical feed through 150 may be provided to coupled electrical energy to one or more electrodes disposed within the substrate support 116, as discussed below. The chamber 110 may be supplied with a substantially flat dielectric ceiling 120. Alternatively, the chamber 110 may have other types of ceilings, e.g., a dome-shaped ceiling. An antenna comprising at least one inductive coil element 312 is disposed above the ceiling 120 (two co-axial elements 112 are shown). The inductive coil element 112 is coupled to a plasma power source 118 through a first matching network 119. The plasma power source 118 typically may be capable of producing up to 3000 W at a tunable frequency in a range from 50 kHz to 13.56 MHz.

As illustrated in FIG. 1, the substrate support 116 may include a plurality of components, such as electrodes, heaters, and the like, which may operated by one or more mechanisms 148 disposed below the substrate support 116. For example, and as shown in FIG. 1, the one or more mechanisms may be coupled to the substrate support 116 through an opening 115 disposed through the conductive body (wall 130). A bellows 152 may be provided to facilitate maintaining a seal between the interior of the process chamber and the outside of the process chamber while allowing the substrate support to move relative to the process chamber. For example, the bellows 152 may compress or expand as the substrate support 116 is raised or lowered within the processing volume 117. The one or more mechanisms 148 may include a lift mechanism 154 that may be utilized to raise and lower the substrate support 116 relative to one or more plasma generating elements, such as the inductive coil elements 112, disposed above the substrate support 116. The one or more mechanisms 148 are described in further detail below and with respect to FIG. 4.

Figure 2:
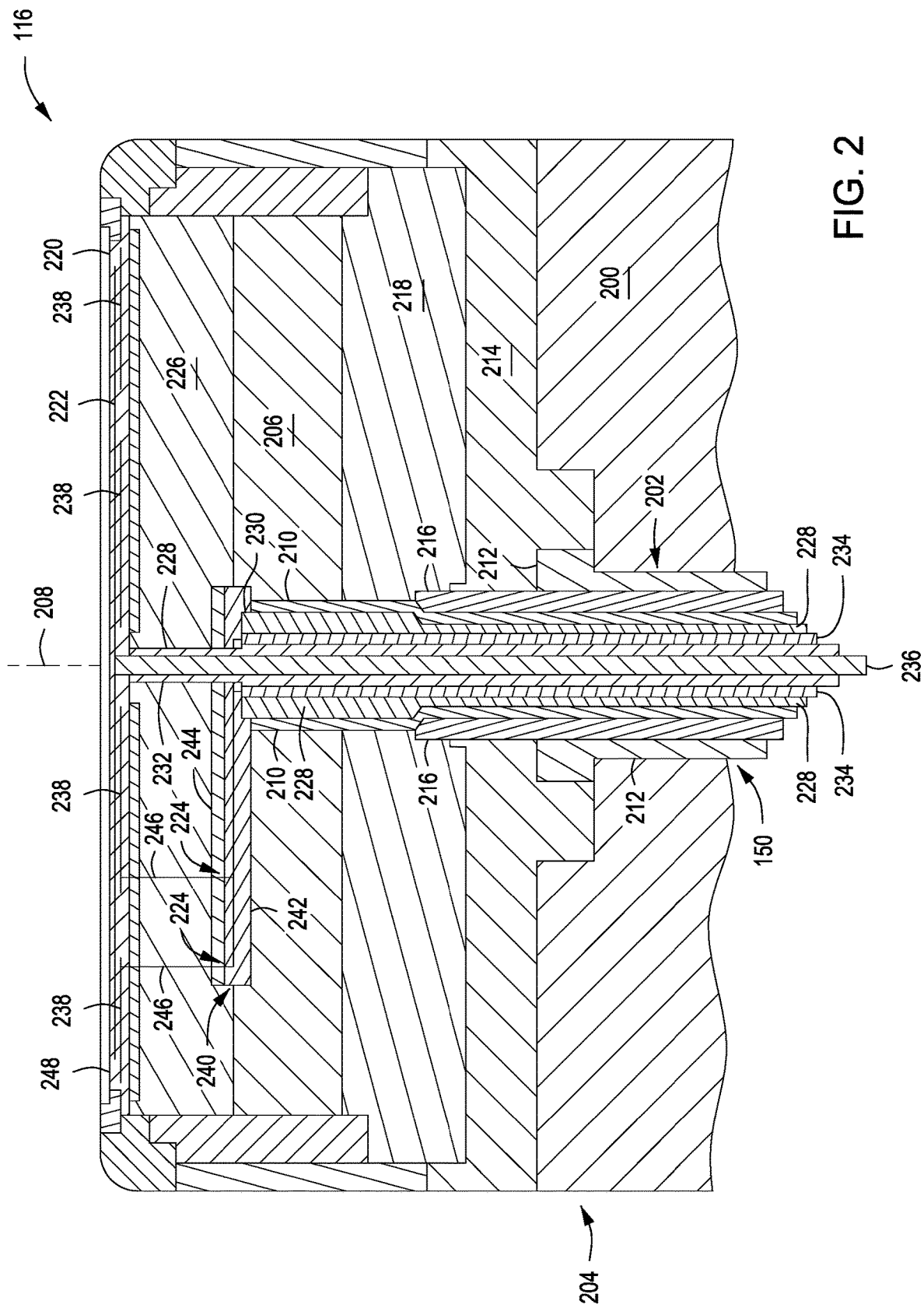
FIG. 2 depicts a schematic side view of substrate support in accordance with some embodiments of the present invention.

FIG. 2 depicts a schematic side view of the substrate support 116 and symmetric electrical feed structure 150 in accordance with some embodiments of the present invention. As illustrated in FIG. 2, the substrate support may include a base 200 having a central opening 202. The central opening 202 may be utilized, for example, to provide one or more conductors therethrough to couple one or more of radio frequency (RF), alternating current (AC), or direct current (DC) power from the one or more mechanisms 148 disposed below the substrate support 116. The base 200 may have a protruding portion 204 to facilitate coupling the base 200 to other components of the process chamber.

Figure 4:
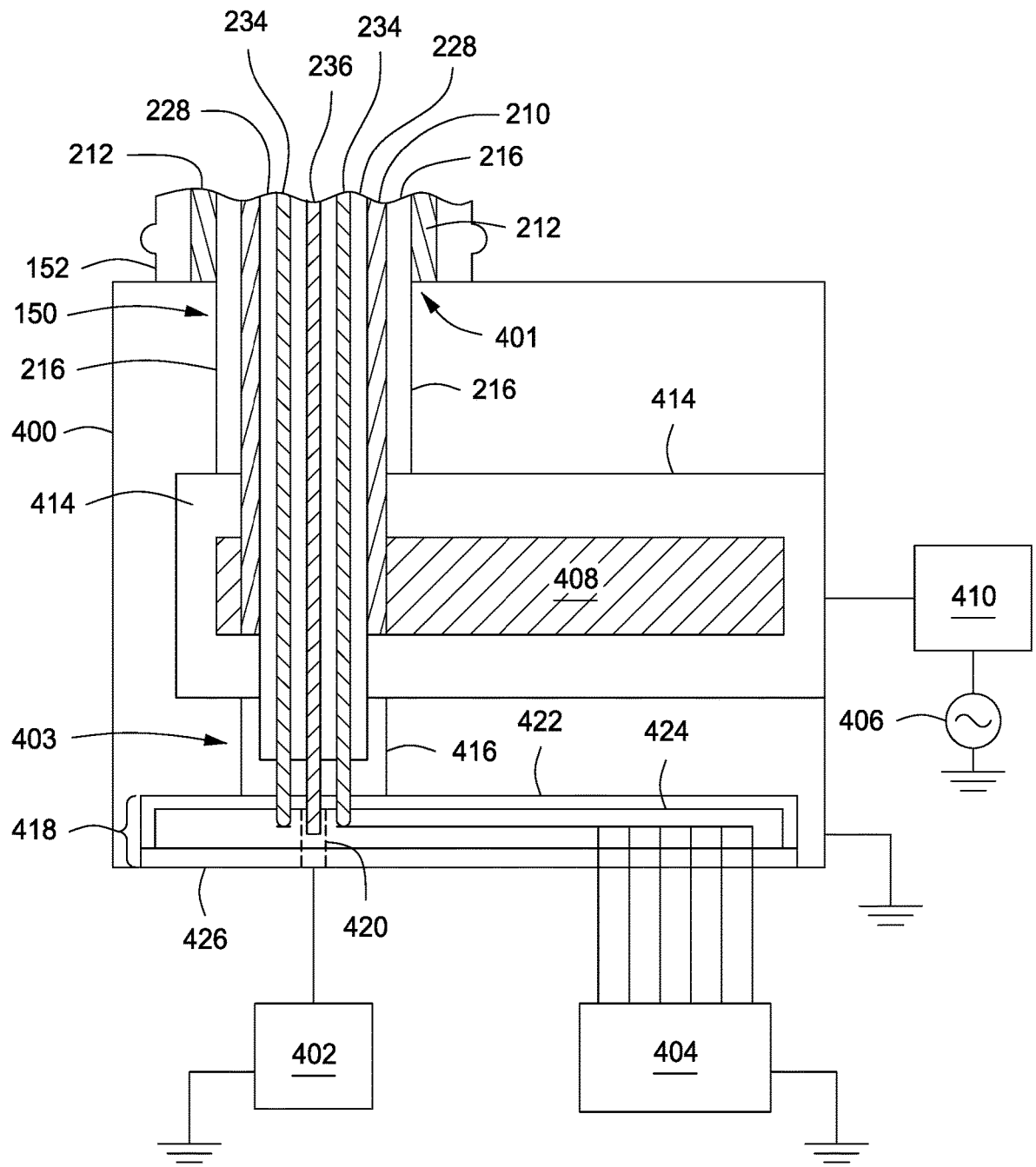
FIG. 4 depicts a schematic side view of mechanisms coupled to a substrate support in accordance with some embodiments of the present invention.

The substrate support 116 may include a first electrode 206 disposed within the substrate support 116 to provide RF power to a substrate, such as the substrate 114 (shown in FIG. 1), when disposed on the substrate support 116. The first electrode 206 may include a central axis 208. An inner conductor 210 may be coupled to the first electrode 206. The inner conductor 210 may be a cylindrical tube having a central axis aligned with the central axis 208 such that the inner conductor 210 may provide RF energy to the first electrode 206 in a symmetrical manner. The inner conductor 210 generally extends away from the first electrode 206 parallel to and about the central axis 208. The inner conductor 210 may extend through the central opening 202 in the base 200 (as shown), through the bellows 152 (shown in FIG. 1), and into the one or more mechanisms 148 (as illustrated in FIG. 4, described below). The inner conductor 210 may comprise any suitable conducting material, such as copper (Cu), aluminum (Al), gold-plated copper, or the like. In some embodiments, the inner conductor may comprise copper.

The substrate support 116 further includes an outer conductor 212 disposed about at least portions of the inner conductor 210. The outer conductor 212, similar to the inner conductor 210, may be tubular in shape and extend generally parallel to and about the central axis 208. The outer conductor 212 may comprise any suitable conducting material, such as aluminum (Al), copper (Cu), or the like. In some embodiments, the outer conductor 212 may comprise Al. The outer conductor 212 may extend away from a conductive plate 214 disposed above the base 200. The outer conductor 212 may be coupled to an electrical ground, such as by having an opposing end of the outer conductor 212 coupled to a case 400 which contains the one or more mechanisms 148 as shown in FIG. 4 and described below. Alternatively, the outer conductor 212 may be separately grounded (not shown).

An outer dielectric layer 216 may be disposed between the inner and outer conductors 210, 212 to electrically isolate the outer conductor 212 from the inner conductor 210. The outer dielectric layer 216 may comprise any suitable dielectric material, such as a polytetrafluoroethylene (PTFE)-containing material, such as TEFLON® (available from DuPont of Wilmington, Del.), or the like. In some embodiments, the outer dielectric layer 216 may comprise PTFE. In operation, electrical energy, such as RF energy, may flow through the inner conductor 210 to the first electrode 206. An electric field may typically exist between the inner conductor 210 and any other conductive element proximate the inner conductor 210. Further, a magnetic field may be induced by the electrical current flowing through the inner conductor 210. The outer conductor 212 may act to confine the electric and magnetic fields to the region between the inner and outer conductor 210, 212, e.g., to the region which includes the outer dielectric layer 216. The confinement of the electric and magnetic fields to this region may result in improved uniformity in the distribution of the electric and magnetic fields, which can result in improved etch rate and etch dimension uniformity on the substrate 114 disposed atop the substrate support 116. Further the conductive plate 214 may similarly act to confine the electric and magnetic fields and/or symmetrically distribute the electric and magnetic fields about the conductive plate 214. Additionally, the conductive plate 214 may act as a shield to isolate the substrate 114 from asymmetric electric and magnetic fields caused by other components, such as a first conductor 408 illustrated in FIG. 4, described below.

The substrate support 116 may further include a dielectric layer 218 disposed between the first electrode 206 and the conductive plate 214. The dielectric layer 218 may comprise a process compatible dielectric material, such as Rexolite®, a cross-linked polystyrene, available from C-Lec Plastics, Inc. of Philadelphia, Pa., or the like. The dielectric layer 218 may be utilized to limit power losses, for example, between the first electrode 206 and the conductive plate 214.

In some embodiments, the substrate support 116 may include an electrostatic chuck (ESC) 220 disposed above the first electrode 206. The ESC may generally comprise a base layer 226 having a dielectric layer 248 disposed over the base layer 226. The base layer 226 may be a cooling plate to facilitate keeping the electrostatic chuck 220 at a desired temperature during operation. For example, the base layer 226 may comprise a highly heat conductive material, such as aluminum or copper, and may have one or more channels for flowing a heat transfer fluid through the channels.

The ESC 220 may include a second electrode 222. In some embodiments the second electrode 222 may be disposed within the dielectric layer 248. The second electrode 222 may be coupled to a source of DC energy to electrostatically secure the substrate 114 to the substrate support 116 via a second conductor 236. In some embodiments, the second conductor 236 may be disposed along the central axis 208 and within the axial opening of the inner conductor 210 in order to minimize any RF interference from the DC energy being provided and to make any such RF interference symmetrical. In some embodiments, the second conductor 236 may be a conductive rod. The second conductor 236 may be fabricated from any suitable process-compatible conductive material. In some embodiments, the second conductor 236 comprises copper.

In some embodiments, the ESC 220 may further include one or more heater electrodes 238. In some embodiments the one or more heater electrodes 238 may be disposed within the dielectric layer 248. The one or more heater electrodes 238 may be provided in any suitable pattern and may be arranged in one or more heater zones to provide a desired heating pattern for heating the substrate. The one or more heater electrodes 238 may be coupled to a source of AC energy via a plurality of third conductors 234. Application of AC energy to the one or more heater electrodes 238 causes the electrodes to heat up by resistive heating (i.e., Joule heating). In some embodiments, the third conductors 234 may be conductive rods. The third conductors 234 may be fabricated from any suitable process-compatible conductive material. In some embodiments, the third conductors 234 comprise copper.

In some embodiments, an electrical distribution plate 240 may be provided to route the connections from the plurality of third conductors 234 to the one or more heater electrodes 238. For example, in some embodiments, the electrical distribution plate 240 may include a printed circuit board (PCB) 242, or the like, for connecting to the plurality of third conductors 234 and for providing conductive paths (e.g., electrical traces) to a plurality of AC terminals 224. An AC terminal insulator plate 244 may be disposed over the PCB 242 to insulate the conductive paths and the AC terminals 224 from adjacent conductive elements, such as the base layer 226 of the ESC 220. Conductors 246 may be provided to couple the AC terminals 224 to respective ones of the plurality of third conductors 234. In some embodiments, the conductors 246 may be conductive rods. In some embodiments, the conductors 246 may comprise copper.

In some embodiments, the third conductors 234 may be symmetrically disposed about the central axis 208. In some embodiments, the third conductors 234 may be symmetrically disposed about the central axis 208 and may be disposed within the axial opening of the inner conductor 210 (as shown). In some embodiments, the AC terminals 224 may be symmetrically disposed about the central axis 208, for example, having each AC terminal 224 in alignment with a respective one of the plurality of third conductors 234. The inventors have found that the symmetrical arrangement of the third conductors 234 about the central axis 208 can further minimize RF interference and improve process performance, such as improving etch rate uniformity and/or etch dimension uniformity on a substrate.

In some embodiments, the second conductor 236 and the plurality of third conductors 234 may be routed through the open central portion of the inner conductor 210. An inner dielectric layer 228 may be disposed within the inner conductor 210 and may have the second conductor 236 and the plurality of third conductors 234 routed through passages disposed through the inner dielectric layer 228. The passages of the inner dielectric layer 228 may insulate the second conductor 236 and the plurality of third conductors 234 from each other, from the inner conductor 210, and from other adjacent electrically conductive components or layers. The passages of the inner dielectric layer 228 may further position the second conductor 236 and the plurality of third conductors 234 in a desired location or pattern, such as a symmetric pattern. The inner dielectric layer 228 may comprise similar dielectric materials as discussed above for the outer dielectric layer 216.

Figure 3:
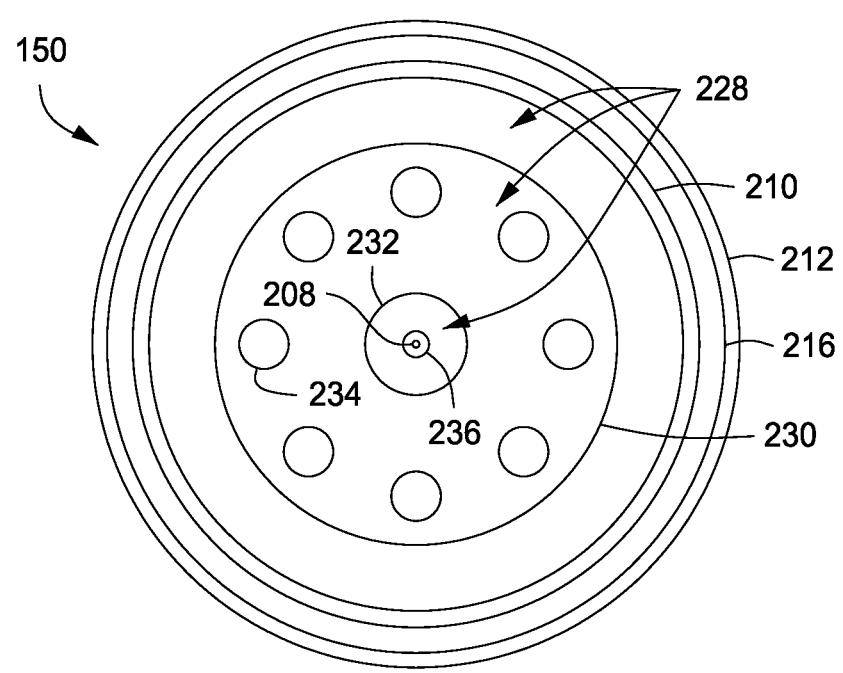
FIG. 3 depicts a top cross sectional view of a plurality of conductors arranged about a central axis in accordance with some embodiments of the present invention.

The inner dielectric layer 228, as shown in FIG. 2 and in top cross sectional view in FIG. 3, is generally disposed within the inner conductor 210, but may extend beyond the end of the inner conductor 210 to surround at least a portion of the lengths of the second conductor 236 and the plurality of third conductors 234 that extend beyond the end of the inner conductor 210. For example, the inner dielectric layer 228 may include a first portion 230 surrounding a portion of the plurality of third conductors 234 that extend past the end of the inner conductor 210 toward the electrical distribution plate 242. A second portion 232 may surround a portion of the second conductor 236 that extends past the end of the inner conductor 210 toward the second electrode 222.

FIG. 3 illustrates a schematic partial top view of the symmetric electrical feed structure 150 in accordance with at least some embodiments of the present invention. As shown in FIG. 3, the symmetric electrical feed structure 150 includes the inner conductor 210 and the outer conductor 216 separated by the outer dielectric layer 216. The inner dielectric layer 228 insulates and positions the second conductor 236 and the plurality of third conductors 234 in a desired pattern (e.g., symmetrically). For example, the second conductor 236 may be centrally disposed in the inner dielectric layer 228 along the central axis 208 and the plurality of third conductors 234 may be disposed symmetrically about the central axis 208.

FIG. 4 depicts a schematic side view of a lower portion of the symmetric electrical feed structure 150 showing the one or more mechanisms 148 coupled to the substrate support 116 in accordance with at least some embodiments of the present invention. As shown in FIG. 4, the lower portion of the symmetric electrical feed structure 150 may provide for the connection to a source of RF energy and optionally, one or more of AC or DC energy. For example, the inner conductor 210 may be coupled to an RF power source 406, for example, via a first conductor 408, to provide RF energy to the first electrode 206 via the first conductor 408. In some embodiments, the second conductor 236 may be coupled to a DC power source 402 to provide DC energy to the second electrode 222 to electrostatically retain a substrate on the substrate support 116. In some embodiments, the plurality of third conductors 234 may be coupled to an AC power supply 404 to provide AC energy to the electrodes 238 to provide heat to the substrate.

The first conductor 408 may be coupled to the inner conductor 210 about the outer surface of the inner conductor 210 to provide the RF energy symmetrically to the inner conductor 210. The first conductor 408 may extend laterally from the central axis 208 toward the RF power source 406, which may be disposed to the side of the central axis 208.

The RF power source 406 may be coupled to the first conductor 408 via a match network 410. The RF power source 406 may provide RF energy at any suitable frequency and power for a particular application. In some embodiments, the RF power source 406 may be capable of providing up to about 1500 W of RF energy at a frequency of about 13.56 MHz. The RF power may be provided either in a continuous wave or pulsed mode.

In some embodiments, a second dielectric layer 414 may be provided to electrically isolate the first conductor 408 from adjacent electrically conductive components (such as a grounding case 400, discussed below, that encloses the lower portion of the electrical feed structure 150). In some embodiments, and as shown in FIG. 4, the first conductor 408 may be embedded within the second dielectric layer 414.

Although the first conductor 408 is disposed at an angle to the inner conductor 210, which may result in a disturbance in the electromagnetic field created by the RF current, the conductive plate 214 may function to limit the electromagnetic effect caused by the orientation of the first conductor 408. As such, any asymmetries in the electric field that might be generated due to the orientation of the first conductor should have limited or no affect on processes being performed on a substrate disposed on the substrate support 116.

In some embodiments, a dielectric end cap 416 may be provided about the end of the RF feed structure 150. For example, the dielectric end cap 416 may be placed about a portion of the inner dielectric layer 228 that extends beyond the inner conductor 210. In some embodiments, the dielectric end cap 416 may cover a portion of the inner dielectric layer 228 that extends beyond the second dielectric layer 414. The dielectric end cap 416 may have a plurality of openings to allow the conductors of the electrical feed structure 150 to extend therethrough. The conductors may be respectively coupled to the DC power supply 402 and/or the AC power supply 404 by respective conductive paths coupled to the plurality of conductors 234 and the conductor 236. For example, a printed circuit board (PCB) 418 may be provided having electrical traces formed therein or thereon to route the plurality of conductors 234 to the AC power supply 404. A separate conductive path may be provided to couple the conductor 236 to the DC power supply 402. In some embodiments, a terminal 420 (shown in dotted lines) may be provided to facilitate coupling of the conductor 236 to the DC power supply 402. The terminal 420 may extend through the entire PCB 418 or just a portion of the PCB 418. In some embodiments, the PCB 418 may comprise a base 422, a substrate 424 supported by the base 422, and a cover 426. The cover 426 may cover the substrate 424 and retain the substrate 424 between the base 422 and the cover 426. Openings may be provided in the cover 426 to facilitate making electrical connections to the conductors 234, 236, the terminal 420, and/or any electrical traces in or on the substrate 424 or passing through the substrate 424.

In some embodiments, a grounding case 400 may be provided to substantially enclose the lower portion of the symmetric electrical feed structure 150, for example, in the region where RF energy is coupled to the inner conductor 210. The grounding case 400 may include an opening 401 through which one or more components of the symmetric electrical feed structure 150, such as the outer dielectric layer 216, inner conductor 210, inner dielectric layer 228, second conductor 236, and plurality of third conductors 234, may be disposed. In some embodiments, and as shown in FIG. 4, an end of the bellows 152 and an end of the outer conductor 212 may be coupled to the grounding case 400 proximate the opening 401. In some embodiments, the grounding case 400 may provide the electrical ground for the outer conductor 212.

The grounding case 400 may also have an opening 403 to facilitate routing the second conductor 236 and the plurality of third conductors 234 to the respective DC and AC power sources. The inner dielectric layer 228 and/or the dielectric and 416 may electrically isolate the second and third conductors 234, 236 from the grounding case 400, as shown. In some embodiments, additional conductors may be provided to respectively couple the second conductor 236 and the plurality of third conductors 234 to the DC power source 402 and the AC power supply 404.

Returning to FIG. 1, the controller 140 comprises a central processing unit (CPU) 144, a memory 142, and support circuits 146 for the CPU 144 and facilitates control of the components of the chamber 110. To facilitate control of the process chamber 110 as described above, the controller 140 may be one of any form of general-purpose computer processor that can be used in an industrial setting for controlling various chambers and sub-processors. The memory 142, or computer-readable medium, of the CPU 144 may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. The methods, such as etch process recipes or the like used to process the substrate 114 may be generally stored in the memory 142 as a software routine. The software routine may also be stored and/or executed by a second CPU (not shown) that is remotely located from the hardware being controlled by the CPU 144.

In operation, the substrate 114 is placed on the substrate support 116 and process gases are supplied from a gas panel 138 through entry ports 126 and form a gaseous mixture. The gaseous mixture is ignited into a plasma 155 in the chamber 110 by applying power from the plasma source 118 and RF power source 406 to the inductive coil element 312 and the first electrode 206, respectively. The pressure within the interior of the chamber 110 is controlled using a throttle valve 127 and a vacuum pump 136. Typically, the chamber wall 130 is coupled to an electrical ground 134. The temperature of the wall 130 is controlled using liquid-containing conduits (not shown) that run through the wall 130.

The temperature of the substrate 114 may be controlled by stabilizing a temperature of the substrate support 116. In one embodiment (not shown), helium gas from a gas source may be provided via a gas conduit to channels (not shown) formed in the surface of the substrate support 116 under the substrate 114. The helium gas may be used to facilitate heat transfer between the substrate support 116 and the substrate 114. During processing, the substrate support 116 may be heated by a resistive heater, such as the plurality of AC terminals 224 discussed above, to a steady state temperature and then the helium gas facilitates uniform heating of the substrate 114. Using such thermal control, the substrate 114 may be maintained at a temperature of about 0 to about 150 degrees Celsius.

Although described with respect to an inductively coupled plasma etch chamber, other etch chambers may be used to practice the invention, including chambers with remote plasma sources, electron cyclotron resonance (ECR) plasma chambers, and the like. In addition, other non-etch chambers that provide RF energy to an electrode disposed in a substrate support may also be modified in accordance with the teachings provided herein.

Thus, apparatus for processing a substrate has been disclosed herein. At least some embodiments of the inventive apparatus may include a symmetric electrical feed structure that may advantageously improve substrate processing, such as etch rate and/or etch dimension uniformities. The inventive symmetric electrical feed structure and substrate supports incorporating same may advantageously reduce electromagnetic skew along the surface of a substrate by conducting electrical power to the various components of the substrate support via one or more conductors that are symmetrically arranged with respect to a central axis of the substrate support and/or by providing one or more elements for confining or uniformly distributing an electric and/or magnetic field.

While the foregoing is directed to embodiments of the present invention, other and further embodiments of the invention may be devised without departing from the basic scope thereof.

The invention claimed is:

1. A substrate support for a plasma processing apparatus, comprising:
a substrate support having a support surface for supporting a substrate the substrate support having a central axis;
a first electrode disposed within the substrate support to provide RF power to a substrate when disposed on the support surface;
an inner conductor coupled to the first electrode about a center of a surface of the first electrode opposing the support surface, wherein the inner conductor is tubular and extends from the first electrode parallel to and about the central axis in a direction away from the support surface of the substrate support;
an inner dielectric layer disposed within and throughout an axial opening of the inner conductor;
an outer conductor disposed about the inner conductor; and
an outer dielectric layer disposed continuously and throughout between the inner and outer conductors.

2. The substrate support of claim 1, wherein the outer conductor is coupled to an electrical ground.

3. The substrate support of claim 2, further comprising:
a conductive plate coupled to the outer conductor.

4. The substrate support of claim 3, further comprising:
a dielectric layer disposed between the first electrode and the conductive plate.

5. The substrate support of claim 4, further comprising:
a first conductor coupled to the inner conductor below the first electrode, the first conductor extending laterally from the inner conductor to an RF power source disposed off-axis from the central axis, the RF power source to provide RF power to the first electrode, wherein the conductive plate is disposed between the first electrode and the first conductor.

6. The substrate support of claim 5, further comprising:
a match network coupled between the RF power source and the first conductor.

7. The substrate support of claim 5, further comprising:
a grounding layer disposed about the first conductor; and
a second dielectric layer disposed between the first conductor and the grounding layer to electrically isolate the grounding layer from the first conductor.

8. The substrate support of claim 7, further comprises:
a second electrode disposed in a dielectric layer above the first electrode to electrostatically retain a substrate disposed on the substrate support when DC energy is supplied to the second electrode.

9. The substrate support of claim 8, further comprising:
a DC power source coupled to the second electrode.

10. The substrate support of claim 9, further comprising:
a second conductor centrally disposed in the inner dielectric layer along the central axis and coupling the second electrode to DC power source.

11. The substrate support of claim 8, further comprising:
a plurality of third conductors disposed in the inner dielectric layer, wherein the plurality of third conductors are disposed symmetrically about the central axis.

12. The substrate support of claim 11, further comprising:
a plurality of heater electrodes disposed between the first electrode and the support surface to provide heat to a substrate when present on the substrate support in response to the application of AC energy to the plurality of heater electrodes.

13. The substrate support of claim 12, wherein the heater electrodes are disposed in a plurality of zones.

14. The substrate support of claim 12, further comprising:
an electrical distribution plate disposed above the first electrode to couple respective ones of the plurality of third conductors to corresponding ones of the plurality of heater electrodes.

15. The substrate support of claim 1, further comprising:
an electrostatic chuck disposed between the first electrode and the support surface, wherein the electrostatic chuck comprises a second electrode disposed in a dielectric layer above the first electrode to electrostatically retain a substrate disposed on the substrate support when DC energy is supplied to the second electrode and a plurality of heater electrodes disposed between the first electrode and the support surface to provide heat to a substrate when present on the substrate support in response to the application of AC energy to the plurality of heater electrodes;
a dielectric layer, wherein the first electrode is disposed between the dielectric layer and the electrostatic chuck; and
a conductive plate disposed on a side of the dielectric layer opposite the first electrode.

16. A plasma processing apparatus, comprising:
a process chamber having an inner volume with a substrate support disposed in the inner volume, the substrate support having a support surface and a central axis;
a first electrode disposed in the substrate support to provide RF power to a substrate when present on the substrate support;
an inner conductor having a first end coupled to the first electrode about a center of a surface of the first electrode facing away from the support surface, wherein the Inner conductor is tubular and extends away from the first electrode parallel to and about the central axis;
an Inner dielectric layer disposed within and throughout an axial opening of the inner conductor;
a first conductor coupled to the inner conductor proximate a second end of the inner conductor, opposite the first end, the first conductor extending laterally from the central axis toward an RF power source disposed off-axis from the central axis, the RF power source to provide RF power to the first electrode;
an outer conductor disposed about the inner conductor; and an outer dielectric layer disposed continuously and throughout between the inner and outer conductors.

17. The plasma processing apparatus of claim 16, further comprising:
   a conductive plate disposed between the first electrode and the first conductor, wherein the conductive plate is coupled to the outer conductor, and wherein the conductive plate and outer conductor are coupled to electrical ground; and
   a dielectric layer disposed between the conductive plate and the first electrode.

18. The plasma processing apparatus of claim 17, further comprising:
   a second electrode disposed in a dielectric layer above the first electrode to electrostatically retain a substrate disposed on the substrate support when DC energy is supplied to the second electrode;
   a plurality of heater electrodes disposed between the first electrode and the support surface to provide heat to a substrate when present on the substrate support in response to the application of AC energy to the plurality of heater electrodes;
   a second conductor centrally disposed in the inner dielectric layer along the central axis; and
   a DC power source coupled to the second electrode via the second conductor.

19. The plasma processing apparatus of claim 18, the substrate support further comprising:
   a lift mechanism coupled to the substrate support.

20. The plasma processing apparatus of claim 18, the substrate support further comprising:
   a plurality of conductors disposed in the inner dielectric layer symmetrically about the central axis; and
   an electrical distribution plate disposed above the first electrode to couple respective ones of the plurality of conductors to corresponding ones of the plurality of heater electrodes.

* * * * *